(12) United States Patent
Sanuki

(10) Patent No.: US 10,026,779 B2
(45) Date of Patent: Jul. 17, 2018

(54) MAGNETORESISTIVE MEMORY DEVICE AND MANUFACTURING METHOD OF THE SAME

(71) Applicant: TOSHIBA MEMORY CORPORATION, Minato-ku, Tokyo (JP)

(72) Inventor: Tomoya Sanuki, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/268,520

(22) Filed: Sep. 16, 2016

(65) Prior Publication Data

US 2017/0256584 A1 Sep. 7, 2017

Related U.S. Application Data

(60) Provisional application No. 62/301,945, filed on Mar. 1, 2016.

(51) Int. Cl.
*H01L 43/12* (2006.01)
*H01L 27/22* (2006.01)
*H01L 43/02* (2006.01)

(52) U.S. Cl.
CPC ............ *H01L 27/228* (2013.01); *H01L 43/02* (2013.01); *H01L 43/12* (2013.01)

(58) Field of Classification Search
CPC ..... H01L 27/22; H01L 27/222; H01L 27/228; H01L 43/00; H01L 43/04; H01L 43/08; H01L 43/10
See application file for complete search history.

(56) References Cited

U.S. PATENT DOCUMENTS

| 7,405,958 | B2 | 7/2008 | Okazawa |
| 7,443,718 | B2 | 10/2008 | Ito et al. |
| 8,411,494 | B2 | 4/2013 | Shukh |
| 8,976,577 | B2 | 3/2015 | Agan et al. |
| 2015/0179244 | A1* | 6/2015 | Seo ........................ G11C 11/161 365/158 |

FOREIGN PATENT DOCUMENTS

JP        3850702 B2    11/2006

* cited by examiner

*Primary Examiner* — Cuong Q Nguyen
(74) *Attorney, Agent, or Firm* — Holtz, Holtz & Volek PC

(57) ABSTRACT

According to one embodiment, a magnetoresistive memory device, includes first wirings arranged parallel to each other in or on a substrate, second wirings arranged parallel to each other above the substrate to cross the first wirings when viewed in a direction perpendicular to a surface of the substrate, and magnetoresistive elements provided corresponding to intersections of the first and second wirings, respectively, and divided into layers.

11 Claims, 9 Drawing Sheets

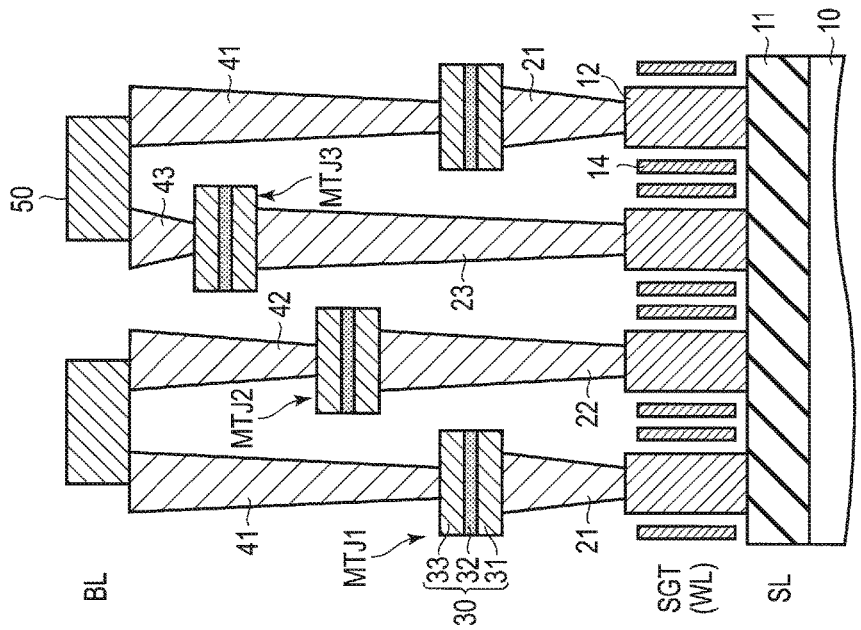
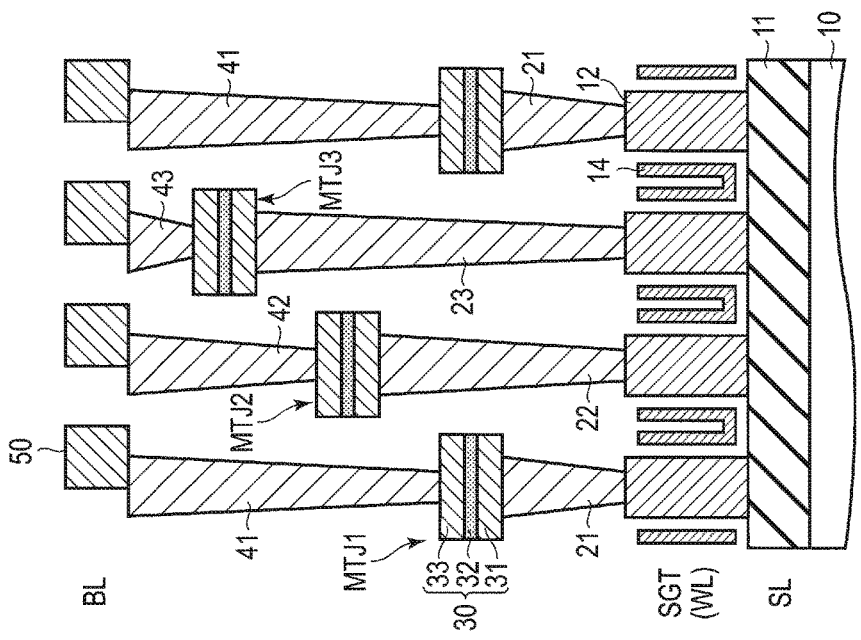

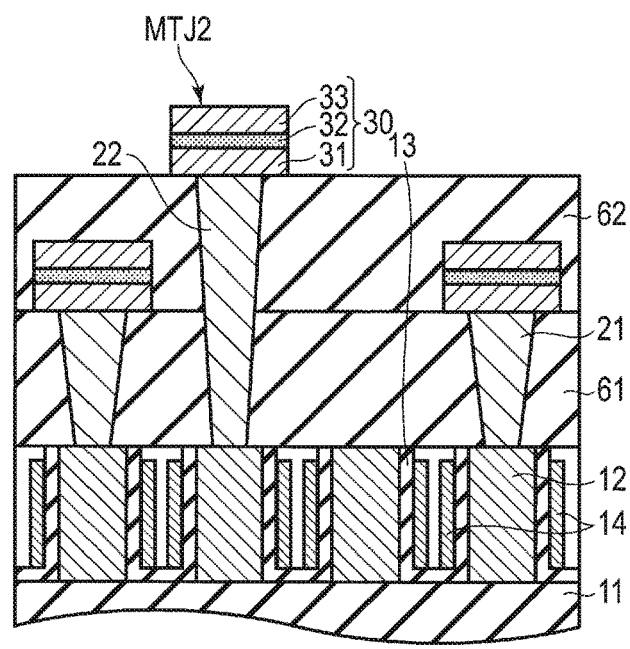
F I G. 5D
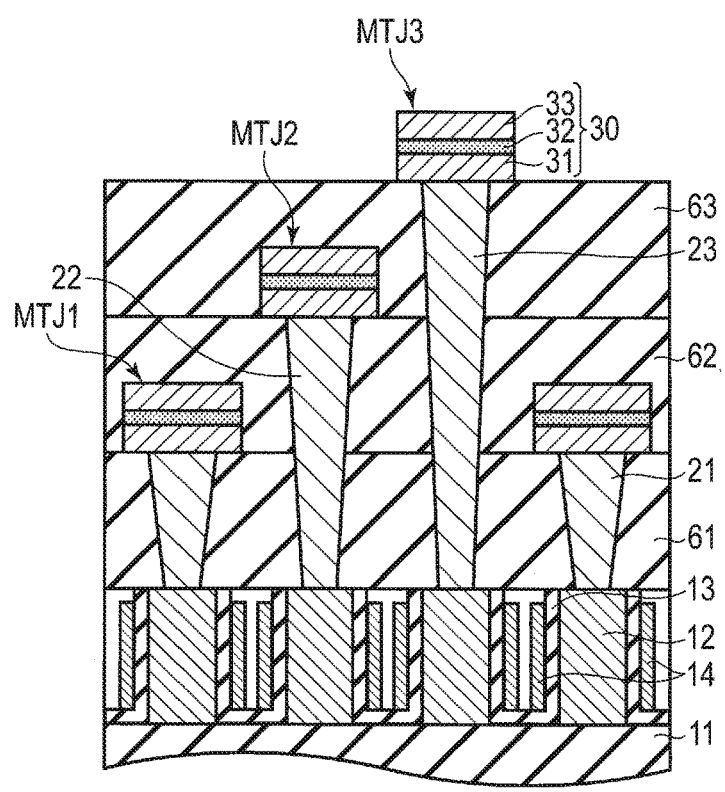
F I G. 5E

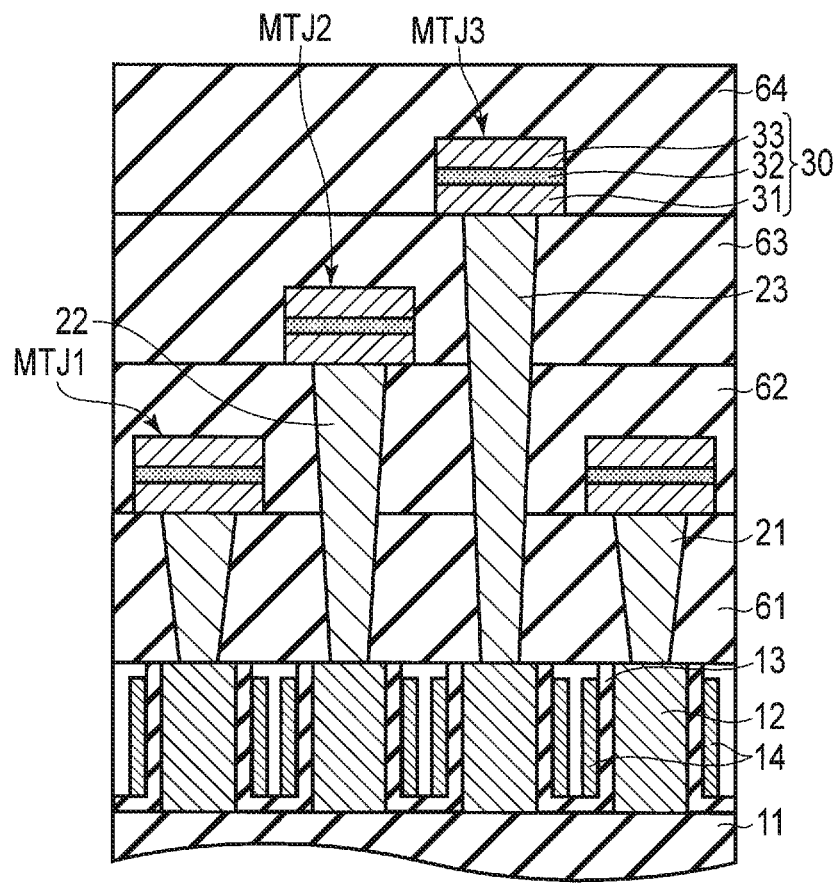
F I G. 5F

US 10,026,779 B2

MAGNETORESISTIVE MEMORY DEVICE AND MANUFACTURING METHOD OF THE SAME

CROSS-REFERENCE TO RELATED APPLICATIONS

This application claims the benefit of U.S. Provisional Application No. 62/301,945, filed Mar. 1, 2016, the entire contents of which are incorporated herein by reference.

FIELD

Embodiments described herein relate generally to a magnetoresistive memory device and a manufacturing method of the same.

BACKGROUND

Recently, a magnetic random access memory (MRAM) using a magnetic tunnel junction (MTJ) element as a memory element has been attracting attention. The MTJ element used for the MRAM is constituted by three thin films, i.e., a storage layer and a reference layer formed of a magnetic material and a barrier layer (insulating layer) sandwiched therebetween. The MTJ element stores data by the magnetization state of the storage layer. In a spin injection MRAM using spin injection magnetization inversion technology, data is written to an MTJ element by energizing the MTJ element in a direction perpendicular to a film surface of the MTJ element.

BRIEF DESCRIPTION OF THE DRAWINGS

FIGS. 4A and 4B are cross-sectional views showing a structure of the memory cell section used for the magnetoresistive memory device of the first embodiment.

FIGS. 5A to 5F are cross-sectional views showing a manufacturing process of the memory cell section of FIGS. 4A and 4B.

DETAILED DESCRIPTION

In general, according to one embodiment, a magnetoresistive memory device, comprises: first wirings arranged parallel to each other in or on a substrate; second wirings arranged parallel to each other above the substrate to cross the first wirings when viewed in a direction perpendicular to a surface of the substrate; and magnetoresistive elements provided corresponding to intersections of the first and second wirings, respectively, and divided into layers.

First Embodiment

Figure 1:
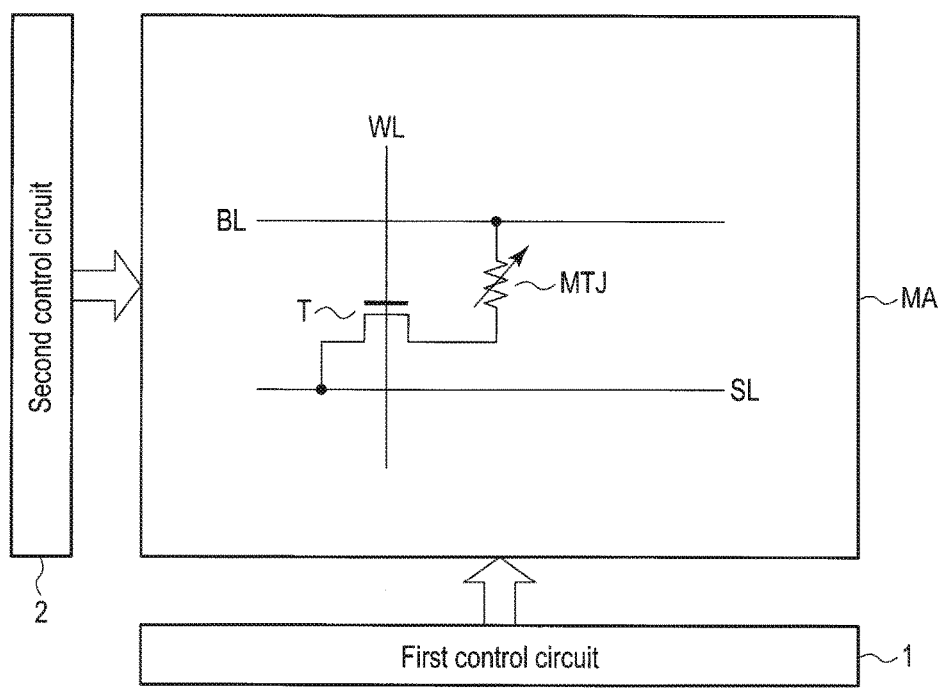
FIG. 1 is a circuit diagram showing a memory cell array section of a magnetoresistive memory device of a first embodiment.

FIG. 1 is a circuit diagram showing a memory cell array section of an MRAM of the first embodiment.

A memory cell in a memory cell array MA comprises a series connection body of an MTJ element serving as a magnetic memory element and a switch element (for example, a field-effect transistor [FET]) T. That is, a memory cell is constituted by a transistor and an MTJ element. One terminal of the series connection body (i.e., one terminal of the MTJ element) is electrically connected to a bit line (second wiring) BL and the other terminal of the series connection body (i.e., one terminal of the switch element T) is electrically connected to a source line SL.

A control terminal of the switch element T, for example, the gate electrode of the FET, is electrically connected to a word line (first wiring) WL. Word lines WL are provided parallel to each other, bit lines are also provided parallel to each other and the bit lines BL cross the word lines WL. The potential of the word lines WL is controlled by a first control circuit 1. The potential of the bit lines BL and the potential of the source lines SL are controlled by a second control circuit 2.

Figure 2:
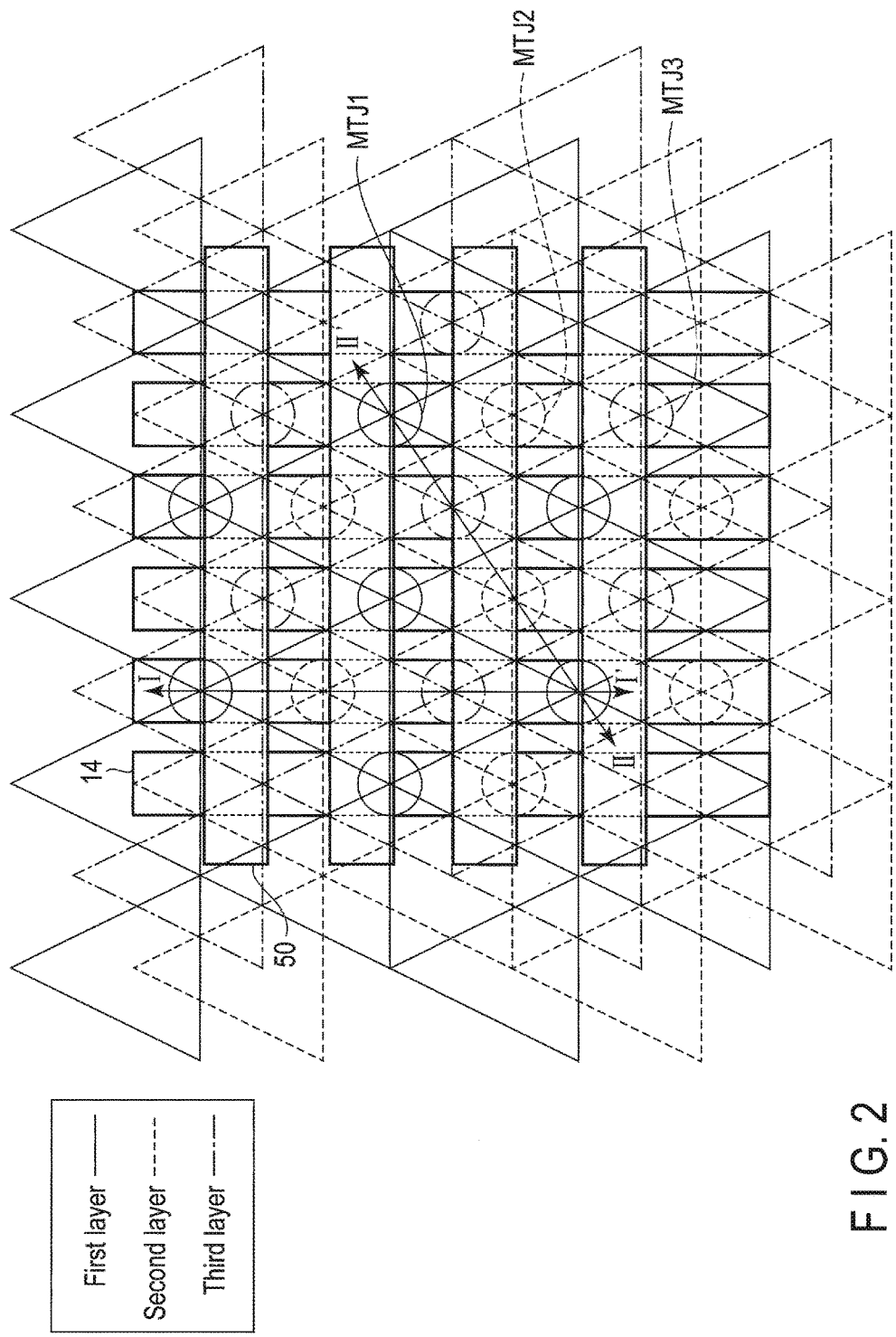
FIG. 2 is a plan view showing a layout of a memory cell section used for the magnetoresistive memory device of the first embodiment.
Figure 3:
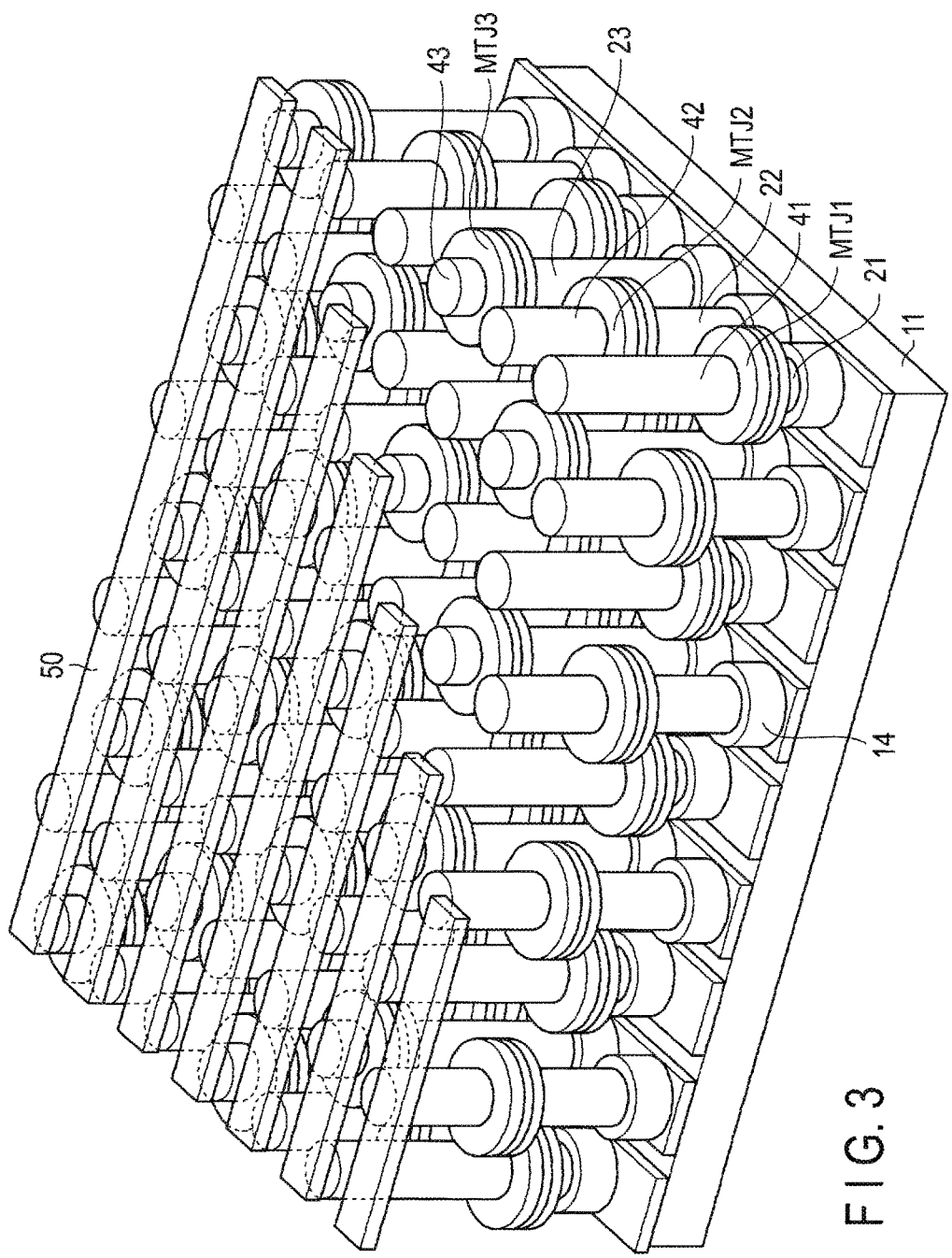
FIG. 3 is a perspective view showing the layout of the memory cell section used for the magnetoresistive memory device of the first embodiment.

FIG. 2, FIG. 3, FIG. 4A and FIG. 4B are illustrations of a structure of a memory cell section used for the MRAM of the first embodiment. FIG. 2 is a plan view showing a layout of the memory cell section. FIG. 3 is a perspective view showing the layout of the memory cell section. FIG. 4A and FIG. 4B are cross-sectional views showing an element structure of memory cells. FIG. 4A is a cross-sectional view along I-I' (word line direction) of FIG. 2. FIG. 4B is a cross-sectional view along II-II' (oblique direction) of FIG. 2.

A diffusion layer 11 to be source lines SL is provided on a surface of a semiconductor substrate 10 of, for example, Si. A semiconductor layer, for example, a Si layer 12 is provided on the diffusion layer 11. The Si layer 12 is arranged like islands so as to have a hexagonal close-packed structure when viewed in a direction perpendicular to the substrate surface.

Word lines 14 covering side surfaces of the Si layer 12 and extending in one direction are provided parallel to each other. A vertical transistor using a bottom portion of the Si layer 12 as a source and a top portion as a drain is formed.

First bottom contacts (first electrodes) 21, second bottom contacts (second electrodes) 22 higher than the contacts 21 or third bottom contacts (third electrodes) 23 higher than the contacts 22 are formed on the Si layer 12. The contacts (electrodes) 21, 22 and 23 are provided in the order of first, second and third in the direction of the word lines. That is, the first bottom contacts 21 are provided at intervals of two contacts, and adjacent contacts 21 form an equilateral triangle. In the same manner, the second and third bottom contacts 22 and 23 are provided at intervals of two contacts, and adjacent contacts form an equilateral triangle. Ta, W, Ti, Mo, TiN (titanium nitride), TaN (tantalum nitride), etc., can be used as the contacts 21 to 23.

The expression "TaN" in the specification means not only that a composition ratio of Ta to N is 1:1 but also that at least Ta and N are contained. The same holds true for expressions of other compounds.

An MTJ element 30 is provided on each of the first to third bottom contacts 21, 22 and 23. That is, a first group (MTJ1) of MTJ elements 30 are provided on the first bottom contacts 21; a second group (MTJ2) of MTJ elements 30 are provided on the second bottom contacts 22; and a third group (MTJ3) of MTJ elements 30 are provided on the third bottom contacts 23.

Adjacent MTJ elements MTJ1 provided on the same layer form an equilateral triangle. Adjacent MTJ elements MTJ2 and MTJ3 also form equilateral triangles. As a result, the MTJ elements 30 are arranged so as to have a hexagonal close-packed structure when viewed in the direction perpendicular to the substrate surface.

Each MTJ element 30 has a structure obtained by sandwiching a tunnel barrier layer (non-magnetic layer) 32 between a storage layer (first magnetic layer) 31 whose direction of magnetization is variable and a reference layer (second magnetic layer) 33 whose direction of magnetization is fixed. As the storage layer 31, CoFeB(cobalt-ion-boron), FeB(ion-boron), etc., can be used. As the tunnel barrier layer 32, MgO (magnesium oxide) can be used. As the reference layer 33, CoPt(cobalt platinum), CoNi(cobalt nickel), CoPd(cobalt palladium), etc., can be used.

Each MTJ element 30 is not limited to the structure in which the storage layer 31 is provided on the substrate side and the reference layer 33 is provided on the opposite side, and may have a structure in which the reference layer 33 is provided on the substrate side and the storage layer 31 is provided on the opposite side. Further, a phase cancellation layer for canceling or reducing a fringe field by the reference layer 33 may be added.

First to third top contacts (fourth electrodes) 41, 42 and 43 are provided on the MTJ elements 30. That is, first top contacts 41 are provided on the MTJ elements MTJ1, second top contacts 42 are provided on the MTJ elements MTJ2 and third top contacts 43 are provided on the MTJ elements MTJ3. A relationship between heights of the contacts 41, 42 and 43 is opposite to that of the corresponding contacts 21, 22 and 23 such that the upper surface of the contacts 41, 42 and 43 are on the same level. The same material as the contacts 21 to 23 can be used for the contacts 41 to 43.

Bit lines 50 are each provided to connect several of the first to third top contacts 41, 42 and 43. The bit lines 50 are provided parallel to each other and extend in a direction crossing the word lines.

Next, a manufacturing method of the memory cell section of the present embodiment is described with reference to FIGS. 5A to 5F. FIGS. 5A to 5F correspond to section II-II' in the same manner as FIG. 4B.

Figure 5A:
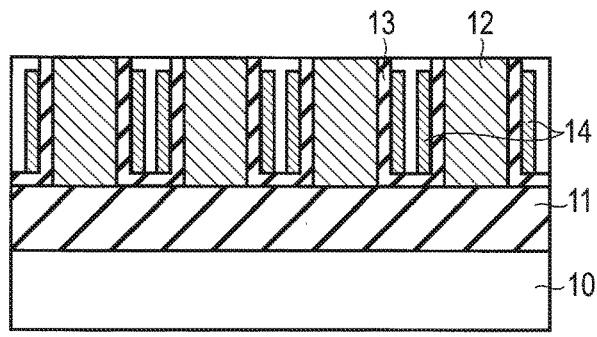

First, as shown in FIG. 5A, a diffusion layer 11 to be source lines SL is formed on a Si substrate 10. A Si layer 12 having the shape of cylinders is formed like islands on the diffusion layer 11. Gate electrodes 14 are formed on side surfaces of the Si layer 12 through gate insulating films 13. Vertical transistors are thereby formed. As shown in FIG. 3, the gate electrodes 14 are continuously formed in the direction of the word lines.

Figure 5B:
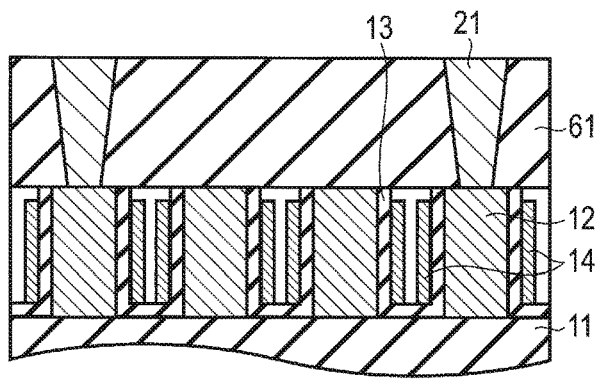

Next, as shown in FIG. 5B, a first interlayer insulating film 61 of $SiO_2$, etc., is deposited on the Si layer 12 and the gate electrodes 14. Next, contact holes corresponding to MTJ elements MTJ1 and connected to the Si layer 12 are formed in the interlayer insulating film 61. After that, first bottom contacts 21 are formed by burying a conductive material in the contact holes.

Figure 5C:
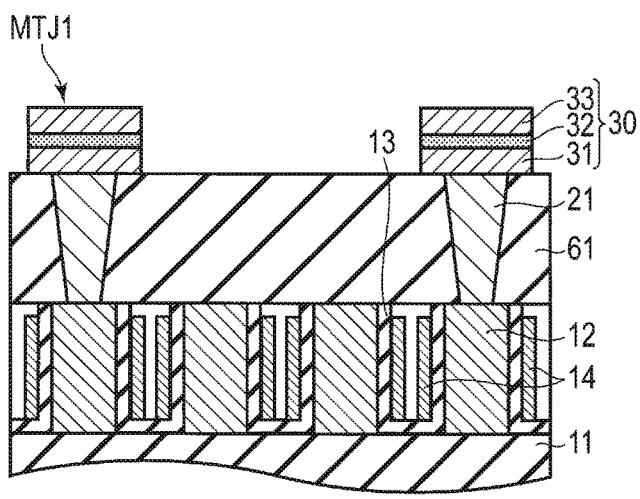

Next, as shown in FIG. 5C, MTJ elements 30 are formed on the contacts 21. More specifically, a first group (MTJ1) of MTJ elements 30 are formed by depositing a storage layer 31 of CoFeB, etc., a tunnel barrier layer 32 of MgO, etc., and a reference layer 33 of CoPt, etc., on the interlayer insulating film 61 and the contacts 21 by, for example, spattering, and then selectively etching the stacked structure into a pattern of the MTJ elements.

Next, as shown in FIG. 5D, a second interlayer insulating film 62 of $SiO_2$, etc., is deposited on the MTJ elements MTJ1 and the interlayer insulating film 61. Following that, second bottom contacts 22 corresponding to MTJ elements MTJ2 are formed by burying a conductive material in the interlayer insulating film 62. Then, a second group (MTJ2) of MTJ elements 30 are further formed on the contacts 22.

Next, as shown in FIG. 5E, a third interlayer insulating film 63 of $SiO_2$, etc., is deposited on the MTJ elements MTJ2 and the interlayer insulating film 62. Following that, third bottom contacts 23 corresponding to MTJ elements MTJ3 are formed by burying a conductive material in the interlayer insulating film 63. Then, a third group (MTJ3) of MTJ elements 30 are further formed on the contacts 23.

Next, as shown in FIG. 5F, a fourth interlayer insulating film 64 is formed on the MTJ elements MTJ3 and the interlayer insulating film 63. After that, top contacts 41, 42 and 43 are formed in the second to fourth interlayer insulating films. Then, bit lines 50 each connecting several of the contacts 41, 42 and 43 are formed and the structure shown in FIG. 4A and FIG. 4B is thereby obtained.

Next, an effect that can be achieved by arranging the MTJ elements 30 in the hexagonal close-packed structure as in the present embodiment is described.

Figure 6:
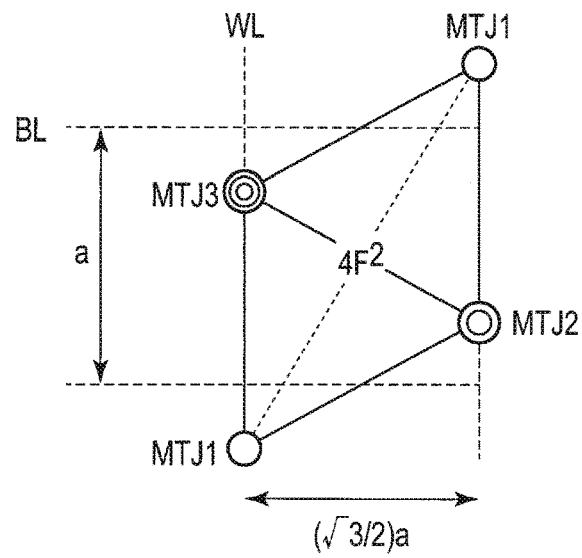
FIG. 6 is a schematic view showing the MTJ pitch in a hexagonal close-packed structure.

In the case where the MTJ elements 30 are divided into three layers and arranged in the hexagonal close-packed structure on the assumption that a cell size is defined as $4F^2$ (F=24 nm), the BL pitch is $$a = (64/3)^{1/4} F = 51.6 \text{ nm},$$

the WL pitch is $$(\sqrt{3}/2)a = 12^{1/4} F = 44.7 \text{ nm},$$

and the pitch between MTJ elements on the same layer (MTJ pitch) is $$2 \times (\sqrt{3}/2)a = 2 \times 12^{1/4} F = 89.3 \text{ nm}$$

from the relationship shown in FIG. 6.
The cell size is $$51.6 \text{ nm} \times 44.7 \text{ nm} = 2306 \text{ nm}^2.$$

As stated above, in contrast to the MTJ pitch of 51.6 nm necessary for forming the MTJ elements 30 in one layer, the MTJ pitch necessary for forming the MTJ elements 30 in three layers is 89.3 rm. That is, in the case of dividing the MTJ elements 30 into three layers, the MTJ pitch can be 1.7 times the MTJ pitch in the case of forming the MTJ elements 30 in one layer. This means that the cell size can be reduced considering that the MTJ elements 30 are arranged at the same pitch.

Figure 7:
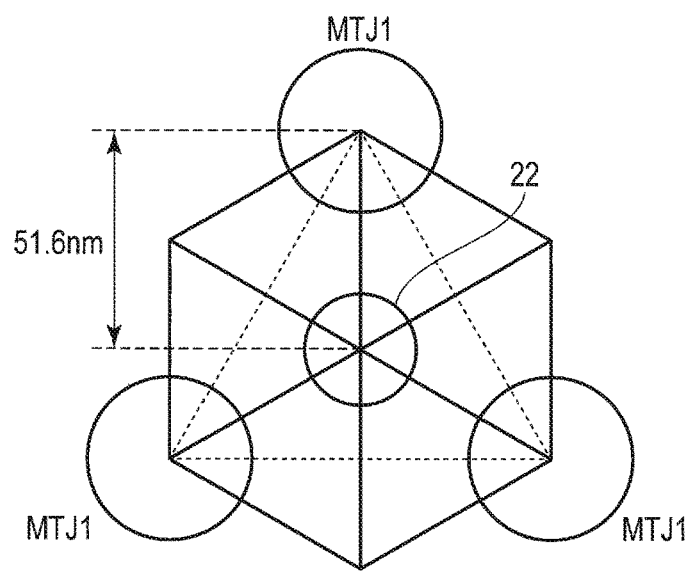
FIG. 7 is a schematic view showing a relationship between MTJ elements and a bottom contact.

With respect to MTJ elements 30 in the same layer, for example, adjacent three MTJ elements MTJ1, a second bottom contact 22 is located in the center of the three MTJ elements MTJ1 as shown in FIG. 7. In this case, the pitch between each MTJ element MTJ1 and the second bottom contact 22 is 51.6 nm, which is equal to the BL pitch. Thus, the MTJ elements MTJ1 and the contact 22 can be arranged without any problem.

If F=19 nm to further reduce the cell size defined as $4F^2$, the BL pitch is 40.8 nm, the WL pitch is 35.4 nm and the MTJ pitch is 70.7 nm. Further, if F=15 nm, the BL pitch is 32.2 nm, the WL pitch is 27.9 nm and the MTJ pitch is 55.8 nm.

According to the present embodiment, the MTJ elements 30 are formed in three layers and arranged so as to have the hexagonal close-packed structure when viewed in a direction perpendicular to the surface of the substrate 10. As a result, the density of the MTJ elements 30 per unit area can be increased by a factor of the number of layers while keeping wide spaces between the MTJ elements 30 in each layer. Therefore, a high-density cell structure can be realized.

Second Embodiment

Figure 8:
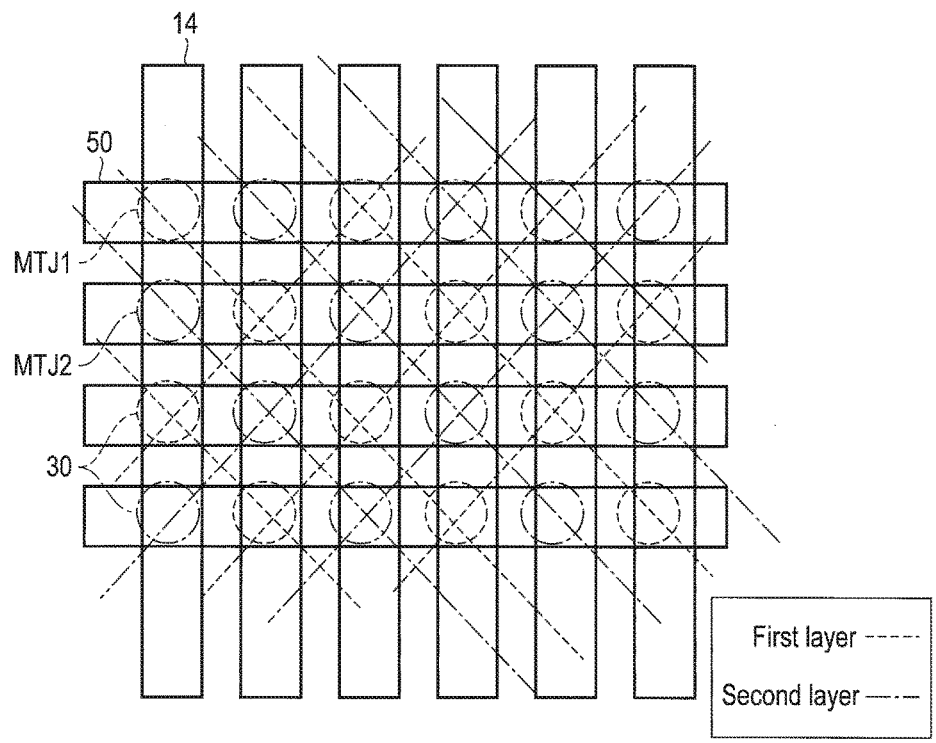
FIG. 8 is a plan view showing a layout of a memory cell section used for a magnetoresistive memory device of a second embodiment.
Figure 9:
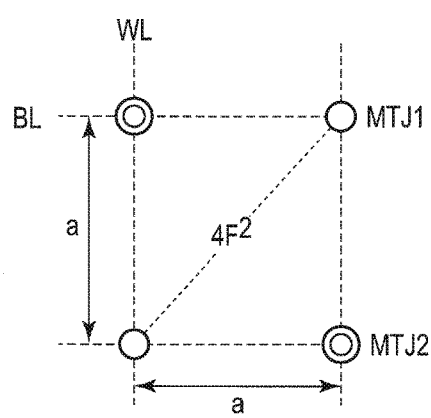
FIG. 9 is a schematic view showing the MTJ pitch in a square lattice structure.

FIG. 8 is a plan view showing a layout of a memory cell section used for a magnetoresistive memory device of the second embodiment. FIG. 9 is an schematic view showing the MTJ pitch. The same elements as those in FIG. 2 are expressed by the same reference numbers and their detailed descriptions are omitted.

The present embodiment is different from the first embodiment in that the MTJ elements 30 are formed in two layers, not three layers.

The MTJ elements 30 are constituted by a first group (MTJ1) of MTJ elements 30 in a first layer and a second group (MTJ2) of MTJ elements 30 in a second layer. Adjacent MTJ elements MTJ1 form a square (shown by dashed lines). Adjacent MTJ elements MTJ2 also form a square (shown by one-dot chain lines). As a result, the MTJ elements 30 have a square grid structure when viewed in a direction perpendicular to the substrate surface.

In the case where the MTJ elements 30 are divided into two layers and arranged in the square grid structure as in the present embodiment on the assumption that the cell size is defined as $4F^2$ (F=24 nm), the BL pitch is $a=2F=48$ nm, the WL pitch is $a=2F=48$ nm, and the MTJ pitch is $\sqrt{2}a=\sqrt{2}\times 2F=67.9$ nm, from the relationship shown in FIG. 9.
The cell size is $48\times 48$ nm=2304 nm$^2$.

As stated above, in contrast to the MTJ pitch of 48 nm necessary for forming the MTJ elements 30 in one layer, the MTJ pitch necessary for forming the MTJ elements 30 in two layers is 67.9 nm. That is, in the case of dividing the MTJ elements 30 into two layers, the MTJ pitch can be 1.4 times the MTJ pitch in the case of forming the MTJ elements 30 in one layer.

If F=19 nm to further reduce the cell size defined as $4F^2$, each of the BL pitch and the WL pitch is 38 nm and the MTJ pitch is 53.7 nm. Further, if F=15 nm, each of the BL pitch and the WL pitch is 30 nm and the MTJ pitch is 42.4 nm.

According to the present embodiment, the MTJ elements 30 are formed in two layers and arranged so as to have the square grid structure when viewed in a direction perpendicular to the surface of the substrate 10. As a result, the density of the MTJ elements 30 per unit area can be increased while keeping wide spaces between the MTJ elements 30 in each layer. Therefore, the same effect as the first embodiment can be achieved.

Modified Example

The present invention is not limited to the above-described embodiments.

In the embodiments, the MTJ elements are divided into three or two layers, but may be divided into four or more layers. The memory cell is not limited to the MTJ element as long as it is a magnetoresistive element.

Further, the select transistor is not limited to the vertical transistor and may have a structure obtained by forming a gate electrode on the surface of the Si substrate 10 through a gate insulating film. Alternatively, the select transistor may have a buried structure obtained by forming a groove in a semiconductor substrate and burying a gate electrode in the groove. The select transistor may have any structure as long as it functions as a switching element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device, comprising:
   first wirings arranged parallel to each other in or on a substrate;
   second wirings arranged parallel to each other above the substrate to cross the first wirings when viewed in a direction perpendicular to a surface of the substrate;
   select transistors provided in a surface portion of the substrate and using the first wirings as gate electrodes; and
   magnetoresistive elements provided corresponding to intersections of the first and second wirings, respectively,
   wherein the magnetoresistive elements are provided between part of the select transistors and the second wirings, and
   wherein the magnetoresistive elements are classified into groups, and the groups are provided in different layers.

2. The device of claim 1, wherein:
   each magnetoresistive element is an MTJ element comprising a first magnetic layer, a second magnetic layer and a non-magnetic layer provided between the first and second magnetic layers.

3. The device of claim 1, wherein:
   one end of each magnetoresistive element is connected to part of a corresponding one of the select transistors via a bottom contact, and
   another end of each magnetoresistive element is connected to a corresponding one of the second wirings via a top contact.

4. The device of claim 1, wherein:
   the select transistors are vertical transistors, and
   the substrate comprises a substrate diffusion layer to be source lines below the gate electrodes.

5. The device of claim 1, wherein:
   the magnetoresistive elements are divided into a first group in a first layer and a second group in a second layer,
   each of the first and second groups are provided at apexes of a square when viewed from the surface of the substrate, and
   the magnetoresistive elements are arranged to have a square lattice structure when viewed in the direction perpendicular to the surface of the substrate.

6. A magnetoresistive memory device, comprising:
a substrate comprising word lines arranged parallel to each other and select transistors using the word lines as gates electrodes;
bottom contacts provided on the substrate and connected to part of the select transistors, respectively;
magnetoresistive elements provided on the bottom contacts, respectively;
top contacts provided on the magnetoresistive elements, respectively;
an interlayer insulating film provided to cover sides of the magnetoresistive elements, the top contacts and the bottom contacts; and
bit lines provided on the interlayer insulating film, each connecting several of the top contacts, arranged parallel to each other and crossing the word lines when viewed in a direction perpendicular to a surface of the substrate,
wherein the magnetoresistive elements are classified into groups, and
wherein the groups are provided in different layers.

7. The device of claim 6, wherein:
each magnetoresistive element is an MTJ element comprising a first magnetic layer, a second magnetic layer and a non-magnetic layer provided between the first and second magnetic layers.

8. The device of claim 6, wherein:
the select transistors are vertical transistors, and
the substrate comprises a substrate diffusion layer to be source lines below the gate electrodes.

9. The device of claim 6, wherein:
the magnetoresistive elements are divided into a first group in a first layer, a second group in a second layer and a third group in a third layer,
each of the first to third groups are provided at apexes of an equilateral triangle when viewed from the surface of the substrate, and
the magnetoresistive elements are arranged to have a hexagonal close-packed structure when viewed in the direction perpendicular to the surface of the substrate.

10. The device of claim 6, wherein:
the magnetoresistive elements are divided into a first group in a first layer and a second group in a second layer,
each of the first and second groups are provided at apexes of a square when viewed from the surface of the substrate, and
the magnetoresistive elements are arranged to have a square lattice structure when viewed in the direction perpendicular to the surface of the substrate.

11. A magnetoresistive memory device, comprising:
first wirings arranged parallel to each other in or on a substrate;
second wirings arranged parallel to each other above the substrate to cross the first wirings when viewed in a direction perpendicular to a surface of the substrate; and
magnetoresistive elements provided corresponding to intersections of the first and second wirings, respectively,
wherein the magnetoresistive elements are divided into a first group in a first layer, a second group in a second layer and a third group in a third layer,
wherein the first to third groups are provided at apexes of an equilateral triangle, respectively, when viewed from the surface of the substrate, and
wherein the magnetoresistive elements are arranged to have a hexagonal close-packed structure when viewed in the direction perpendicular to the surface of the substrate.

* * * * *